United States Patent [19]
Lieu

[11] Patent Number: 5,519,887
[45] Date of Patent: May 21, 1996

[54] SWITCHABLE FILTER PHASE-LOCKED LOOP FREQUENCY SYNTHESIZER DEVICE AND METHOD FOR ACHIEVING DUAL-MODE CELLULAR COMMUNICATIONS

[75] Inventor: Winston H. Lieu, Somerset, N.J.

[73] Assignee: AT&T Corp., Murray Hill, N.J.

[21] Appl. No.: 287,988

[22] Filed: Aug. 9, 1994

[51] Int. Cl.[6] .................................................... H04B 1/06
[52] U.S. Cl. ............................ 455/266; 455/77; 455/306
[58] Field of Search .............................. 455/33.1, 76, 77, 455/260, 266, 306, 303; 375/216, 344; 379/58, 59, 63

[56] References Cited

U.S. PATENT DOCUMENTS

| | | | |
|---|---|---|---|
| 5,119,397 | 6/1992 | Dahlin et al. | 375/216 |
| 5,163,159 | 10/1992 | Rich et al. | 455/74 |
| 5,175,729 | 12/1992 | Borras et al. | 455/76 |
| 5,175,884 | 12/1992 | Suarez | 455/260 |
| 5,276,914 | 1/1994 | Ishizuka et al. | 375/216 |
| 5,335,355 | 8/1994 | Tanaka et al. | 375/216 |
| 5,392,460 | 2/1995 | Mattila et al. | 455/76 |
| 5,404,579 | 4/1995 | Obayashi et al. | 375/216 |

OTHER PUBLICATIONS

National Semiconductor, *LMX1511 1.1 GHz Frequency Synthesizer for RF Personal Communications*, Rev. 2.4, (Preliminary), Jun. 1992, pp. 1–11.
National Semiconductor, *MM54HC4066/MM74HC4066 Quad Analog Switch*, CMOS Logic Book, Rev 1, 1988 Edition, pp. 3–402–3–406.

*Primary Examiner*—Reinhard J. Eisenzopf
*Assistant Examiner*—Marsha D. Banks-Harold

[57] ABSTRACT

A cellular telecommunications device and method for achieving dual-mode cellular communications. The cellular telecommunication device comprises switchable loop filters, a loop filter switch controller, a programmable frequency synthesizer, and a voltage controlled oscillator arranged in a phase-locked loop configuration. The switchable loop filters comprise low-pass filters to optimize the performance of the device in both the analog and digital modes of cellular communications. Mode changes are facilitated by the switch controller which automatically configure the loop filters arrangement in response to a mode code sent to the cellular device from a cellular base station.

13 Claims, 5 Drawing Sheets

100

SWITCHABLE FILTER PHASE-LOCKED LOOP FREQUENCY SYNTHESIZER DEVICE AND METHOD FOR ACHIEVING DUAL-MODE CELLULAR COMMUNICATIONS

BACKGROUND OF THE INVENTION

1. Field of the Invention

The present invention relates to phase-locked loop frequency synthesizer devices. More particularly, the present invention relates to a switchable filter and method in a phase-locked loop frequency synthesizer for achieving dual-mode cellular communications.

2. Related Art

A cellular telecommunication system broadly consists of three components: mobile units (such as, portable or car telephones), cellular base stations (cell sites), and mobile telephone switching office (MTSO). Communications between the mobile units and the cell sites are conducted over radio frequency signal channels. Depending on the base station, these channel communications are governed by one of two types of modes or standards, which are commonly referred to as the analog mode (Advanced Mobile Phone Systems (AMPS)) and the digital mode (Digital Advanced Mobile Phone Systems (DAMPS)). Before the advent of the digital communication standard, base stations uniformly used the analog communication standard. However, due to its advantages over analog communication, more base stations are now utilizing digital communication. As a result, it has become necessary for mobile units to have dual-mode capability. Indeed, the North American Digital Cellular Standard (NADC) requires such dual-mode capability. This is known as the Cellular System Dual-Mode Mobile Station-Base Station Compatibility Standard (EIA/TIA/IS-54-A, March 1991, published by Electronic Industries Association, Engineering Department, 2001 Pennsylvania Avenue, N.W., Washington, D.C. 20006).

This dual-mode requirement, however, places additional burdens on the mobile unit designer. That is, the requirement creates two distinct and conflicting performance specifications for the phase-locked loop (PLL) frequency synthesizer, particularly the loop filter of the synthesizer circuit, employed by these mobile units. The PLL synthesizer is a fundamental component of the mobile unit. The mobile unit includes a transceiver, which comprises a transmitter section and a receiver section. In the transmitter section the PLL synthesizer act as a carrier signal generator and in the receiver section the PLL synthesizer acts as a local oscillator for the communications between the mobile unit and its corresponding cell site. The ability of the PLL synthesizer to eliminate undesired signal interference and undesired noise in both modes has a direct impact on the quality of communications.

The digital mode (DAMPS) effectively requires that the PLL synthesizer utilize a wideband low-pass loop filter (wideband loop filter) to facilitate fast channel switching. This stems from a feature, Mobile Assisted Hand-Off (MAHO), which is unique to the digital mode. Under this requirement, each mobile unit assists the base station in determining which of the available cell channels (frequencies) of the neighboring cell sites is the best to conduct its communications. The mobile unit achieves this by scanning all of the channels that the base station asks it to scan, and identifying the channel with the strongest sustained signal. The measured results of all channels scanned are then reported back to the base station. The base station then processes this information and, if necessary, coordinates the appropriate hand-off (transfer) from one cell site to another.

Accordingly, the PLL synthesizer must be able to switch between channels quickly and efficiently, because the channel scanning has to be done quite often and within a limited period of time. These characteristics correspondingly equate to the need to have a PLL synthesizer with wideband loop filter.

While the use of wideband loop filters allows for a considerable amount of signal phase noise and sideband signals to exist in the synthesized signal, such noise and sidebands do not necessarily affect the quality of communications. This is because digital communications inherently have a high signal-to-noise immunity ratio which allows for the toleration of signals with low spectral purity. In other words, digital communications allow for the PLL synthesizer to have a relaxed loop filer (that is, wideband).

In contrast, it is desirable in the analog mode (AMPS) to have a narrowband low-pass filter (narrowband filter) to eliminate signal phase noise and sidebands. In analog communications, phase noise has a direct effect on the quality of communications. Thus, a narrowband filter is desired to maintain a higher spectral purity of the synthesized signals. The penalty with the use of narrowband filters, however, is that they cause the PLL synthesizer to have slow switching times and less loop stability.

Conventional systems have addressed this inherent conflict generally in two ways. Some have simply ignored the low spectral purity problem in the analog mode, and have employed an optimized wideband loop filter for the digital mode in order to satisfy the fast channel switching time requirement of MAHO. While relatively uncomplicated and cost efficient, the disadvantages of this type of system is the degradation of the communications quality and selectivity in the analog mode. That is, the signal noise not removed by the wideband filter is perceivable by the user whereas the sidebands degrade the mobile unit's ability to reject unwanted interferences.

Other conventional systems provide dual-mode cellular communication with a fractional N synthesizer, which provide for better spectral purity in the analog mode, concurrent with the fast channel switching capability. The drawbacks of these types of systems, however, are their considerable complexity and cost.

SUMMARY OF THE INVENTION

The invention is a switchable phase-locked loop (PLL) frequency synthesizer device and method for achieving dual-mode cellular communications. The device includes a switchable loop filter, a loop filter switch controller, a programmable frequency synthesizer, and a voltage controlled oscillator arranged in a PLL configuration.

The switchable loop filter feature of the present invention satisfies the dual-mode requirement in a cost efficient manner, while optimizing the performance of the synthesizer device in each mode. To accomplish this, the switchable loop filter includes specifically designed narrowband (analog mode) and wideband (digital mode) filters, switches, and a switch controller. The filters and switch are arranged such that the appropriate filter for each mode can be selectively connected into the PLL configuration. In this manner, cellular communication mode changes are automatically facilitated by the switch controller in response to a cellular base station command (or mode code). In other words, the present invention automatically reconfigures itself to provide the optimal loop filter arrangement for each mode of cellular communication.

Thus, the present invention exploits the characteristics of each mode of cellular communication to achieve optimal performance. That is, the present invention utilizes the high signal-to-noise immunity of the digital mode to provide the fast switching by using a wideband loop filter. Similarly, since fast switching is not required in the analog mode, the present invention uses the slower narrowband filter to eliminate more undesired signal noise, thus enhancing the mobile unit's communication quality and channel selectively.

The foregoing, and other features and advantages of the invention will be apparent from the following, more particular description of the preferred embodiments of the invention, as illustrated in the accompanying drawings.

DETAILED DESCRIPTION OF THE PREFERRED EMBODIMENTS

The preferred embodiments of the invention are discussed in detail below. While specific part numbers and/or configurations are discussed, it should be understood that this is done for illustration purposes only. A person skilled in the relevant art will recognize that other components and configurations may be used without parting from the spirit and scope of the invention.

The preferred embodiments of the invention are now described with reference to the figures where like reference numbers indicate like elements. Also in the figures, the left most digit of each reference number corresponds to the figure in which the reference number is first used.

Figure 1:
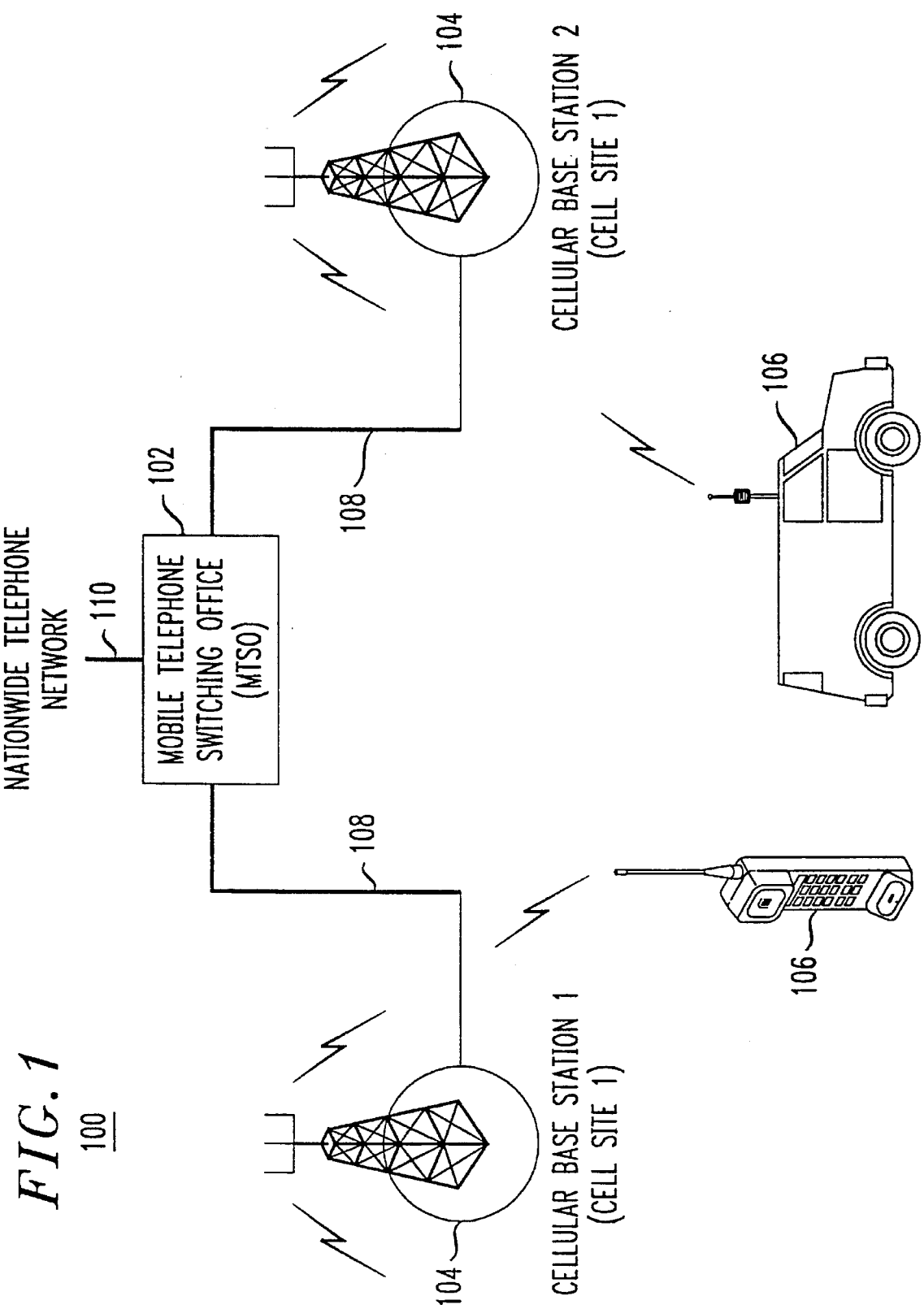
FIG. 1 is a systems level block diagram of a basic cellular telecommunications system 100.

FIG. 1 is a high level block diagram of a basic cellular telecommunications system 100. Cellular system 100 includes mobile telephone switching office (MTSO) 102, multiple cellular base stations (cell sites) 104, and cellular mobile units 106 (representatively illustrated as portable and car telephones). MTSO 102 communicates with base stations 104 over land wires (T-carriers) 108 and microwave radio links (not shown in FIG. 1). MTSO 102 also connects cellular system 100 with a nationwide network 110.

MTSO 102 provides the overall coordination and administration of cellular system 100. Generally, each base station 104 handles the communications or telephone calls within its servicing area or territory. As mobile unit 106 is transported by the user from within the servicing area of one base station 104 to another, MTSO 102 coordinates the hand-off between base stations 104 ensuring continuous, uninterrupted communications.

Mobile units 106 communicate with the base stations 104 over radio frequency (RF) signals, which are commonly referred to as "channels". These channels are divided into two types, control and voice channels. Moreover, each base station 104 has a pre-designated number of both types of channels for communications within its servicing area. Correspondingly, when mobile unit 106 enters the servicing area of base station 104 it is assigned two voice channels (these are the signals in which the voice information is carried). The control channels, however, are used primarily for reporting, programming, and coordinating these voice communications. For any given telephone conversation, mobile unit 106 uses a pair of voice channels, a forward and reverse. The forward channel is used to transmit voice information from base station 104 to mobile unit 106. Whereas, voice information sent from mobile unit 106 to base station 104 is carried on the reverse channel. During a telephone conversation, for example, what a cellular telephone user hears is received on the forward channel, while what the user says is transmitted to on the reverse channel. Currently, the frequency band or range used for the forward channels is 869–894 MHz and 824–849 MHz for the reverse channels.

As discussed in the previous sections, there are also two modes of cellular communication. The analog (AMPS) and digital (DAMPS) modes correspond with the type of communication standard used by base station 104 to communicate with the mobile unit 106. While the analog mode is currently more prevalent, the newer digital switch is increasingly being employed in base stations 104 throughout the country because of its advantages over its counterpart. Namely, these advantages include an inherently greater signal-to-noise ratio and ability to use Time Division Multiplexing Access (TDMA) to increase the user capacity of the cellular system 100. Accordingly, mobile units 106 are required to have dual-mode capability in accordance with the EIA 54-A standard.

Figure 2:
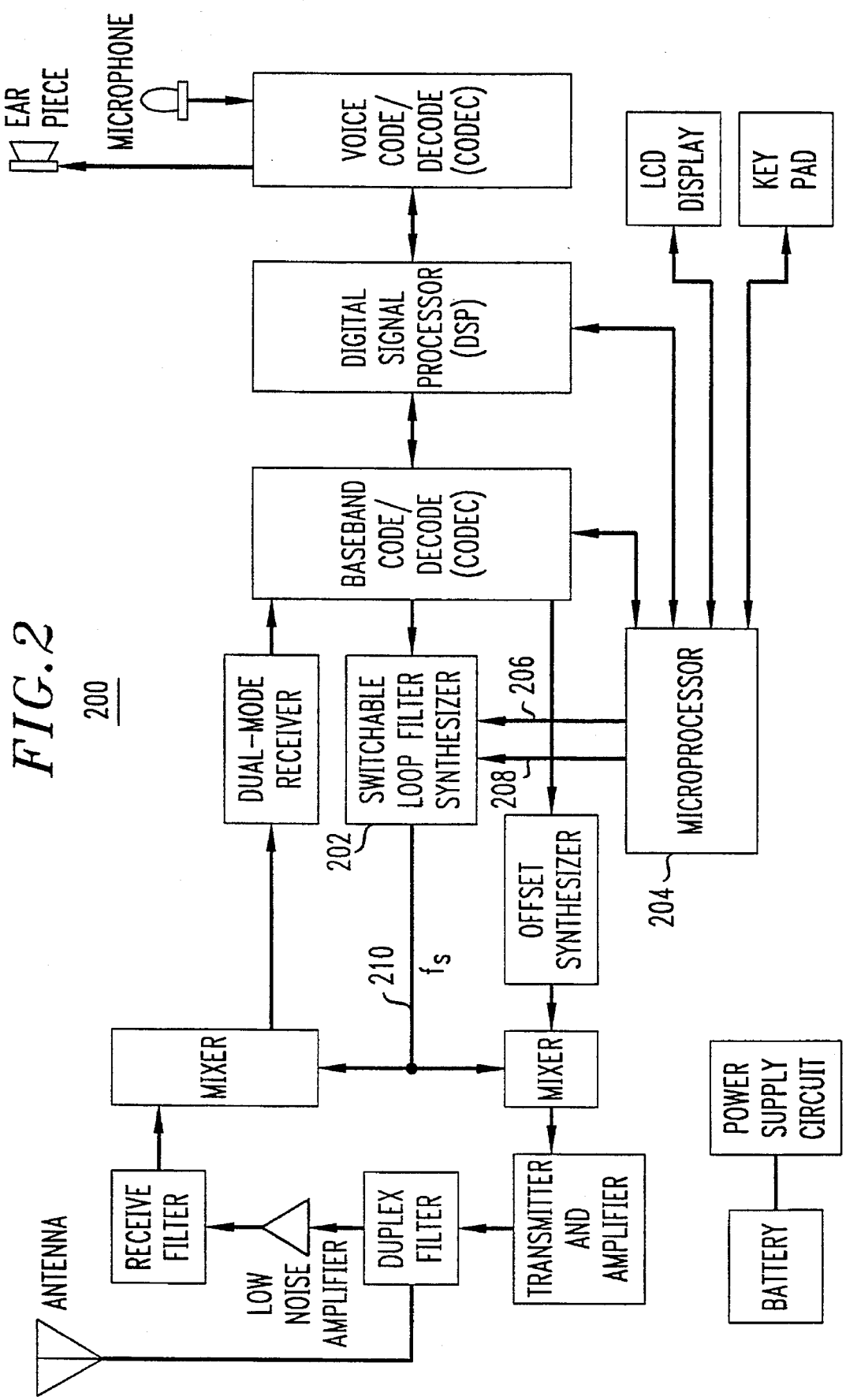
FIG. 2 is a high level block diagram of a dual-mode cellular telephone 200 with a switchable filter phase-locked loop frequency synthesizer 202.

FIG. 2 illustrates, a dual-mode cellular telephone 200 with a switchable falter phase-locked loop frequency synthesizer 202, according to the present invention. Synthesizer 202, which generates a synthesizer signal ($f_s$) 210, has two functions: (1) it is used as a carrier signal generator for transmitting signals to base station 104 and (2) it is used as local oscillator for receiving signals from base station 104. Thus, signal $f_s$ 210 is used as a carrier signal on the reverse channel and a decoding signal on the forward channel.

A microprocessor 204 controls both the mode and channel switching of cellular telephone 200. Microprocessor 204, in this embodiment is a HC series processor manufactured by Motorola, Inc., 1303 East Algonquin Road, Schaumburg, Ill. 60196. However, any commercially available or application specific processor with similar features may be used, such as an x86 series processor manufactured by Intel Corporation, 3065 Bowers Avenue, Santa Clara, Calif. 95051. Cellular telephone 200 receives codes (mode and channel codes) over the control channels from base station 104 that indicate the mode and channel in which the communications are to be conducted, as would be apparent to persons skilled in the art. Using these codes, microprocessor 204 operates synthesizer 202 using mode control signals 206 and channel control signals 208.

Figure 3:
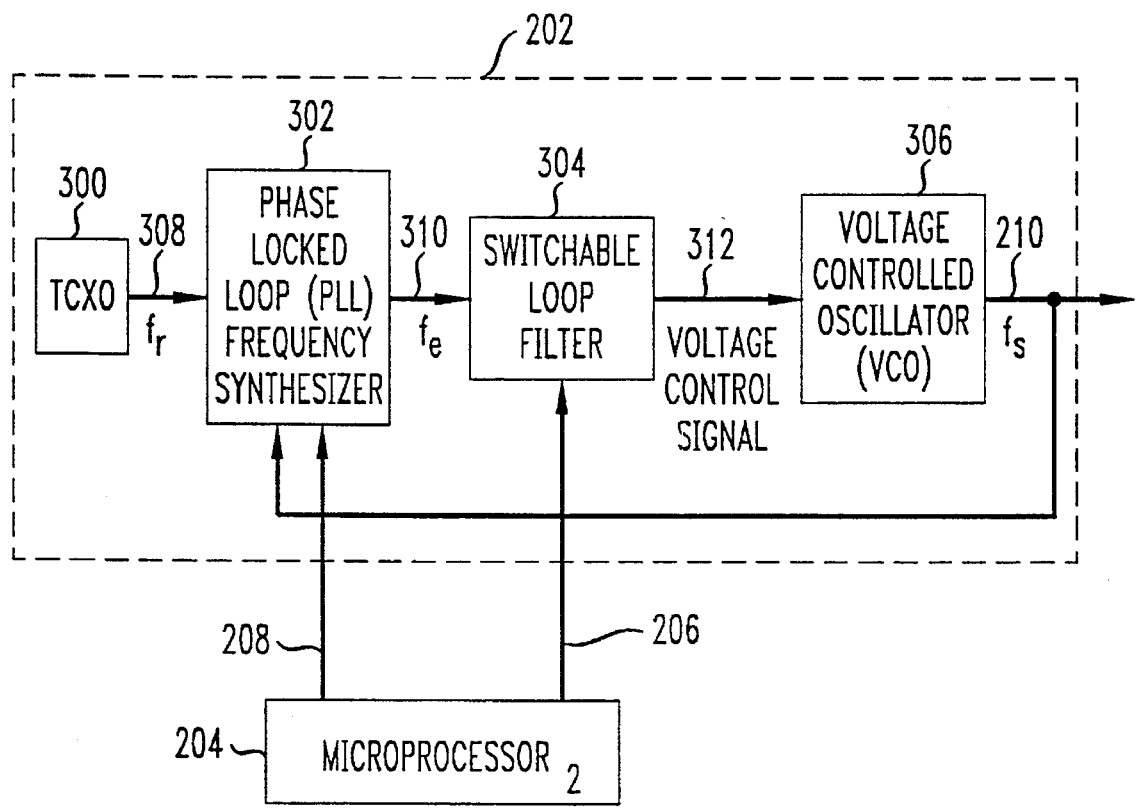
FIG. 3 is a high level block diagram of a switchable filter phase-locked loop frequency synthesizer 202.

FIG. 3 is a high level block diagram of synthesizer 202, according to the present invention. Synthesizer 202 includes, a temperature compensated crystal oscillator (TCXO) 300, a phase-locked loop (PLL) frequency synthesizer 302, a switchable loop falter 304, and a voltage controlled oscillator (VCO) 306.

TCXO 300 generates a free-running, highly stable reference signal ($f_r$) 308. The prominent feature of TCXO 300 is its temperature stability over the full operating range of a cellular telephone 200. As will be discussed in detail subsequently, signal $f_r$ 308 is utilized to ensure the precise channel switching of $f_s$ 210. In this embodiment TCXO 300 is made of discrete components. However, commercially available modules may also be used. One such manufacturer is NDK America, Inc., 47671 Westinghouse Drive, Fremont, Calif. 94539.

The operation of PLL synthesizer 302 is similar to that of a feedback control loop circuit. PLL synthesizer 302 continuously samples and divides down signal $f_s$ 210 in frequency and compares (mixes) the resulting signal with a divided version signal $f_r$ 308. Note that both $f_s$ 210 and $f_r$ 308 are divided down to a common comparison frequency $f_c$. PLL synthesizer 302 also produces an error signal ($f_e$) 310, which is proportional to the phase and/or frequency discrepancy between signal $f_r$ 308 and signal $f_s$ 210. This error signal $f_e$ 310 contains DC as well as frequency components at the comparison frequency $f_c$ and it harmonics. To achieve channel switching, PLL synthesizer 302 has a programmable divider (discussed with reference to FIG. 4) which is used to programmably adjust the divide ratio for signal $f_s$ 210. In this embodiment, PLL synthesizer 302 is similar to the commercially available LMX1511 manufactured by National Semiconductor Corporation, 2900 Semiconductor Drive, Santa Clara, Calif. 95051.

When synthesizer 202 is locked to a channel frequency, the divided versions of signal $f_r$ 308 and signal $f_s$ 210 are identical in phase and frequency, and the resulting signal $f_e$ 301 is at zero output. The voltage control signal 312 that switchable loop filter 304 had produced is therefore constant and is input to and used by VCO 306 to hold signal $f_s$ 210 at that frequency. As a result, the signal $f_s$ 210 is continuously maintained at the programmed channel frequency with its phase and frequency kept as close to that of signal $f_r$ 308 as possible. In this embodiment, VCO 306 is made of discrete components, however, commercially available modules may also be used, such as a VCO manufactured by Murata Erie North America, J. Fraser Avenue, Trenton, Ontario Canada K8V JS1.

A mode and/or channel change, however, brings the divided versions of signal $f_r$ 308 and signal $f_s$ 210 out of lock with each other, and correspondingly their difference, as reflected in signal $f_e$ 301. Error signal $f_e$ 301 is then active and passed through switchable loop filter 304. The output of the loop filter 304, voltage control signal 312, is then varied as a result, such that VCO 306 swiftly reduces this difference by shifting signal $f_s$ 210 in a direction whereby the divided version of signal $f_s$ 210 approaches the phase and frequency of that of signal $f_r$ 308. As soon as the two signals are identical, the resulting signal $f_e$ 301 will again be at zero and thus maintains VCO 306 at the programmed channel frequency.

As with all synthesizer loop filters, the general purpose of switchable loop filter 304 is to eliminate undesirable signal noise and the frequency components at the comparison frequency $f_c$ and its harmonics. Typically, such a filter is optimally designed for one specific cut-off frequency (loop frequency). The dual-mode requirement, however, puts conflicting frequency specifications on the loop filter design.

According to the present invention, synthesizer 202 incorporates a switchable loop filter feature to satisfy these conflicting requirements. As discussed with reference to FIG. 4, switchable loop filter 304 includes two filters each of which is optimally designed for a single mode.

Figure 4:
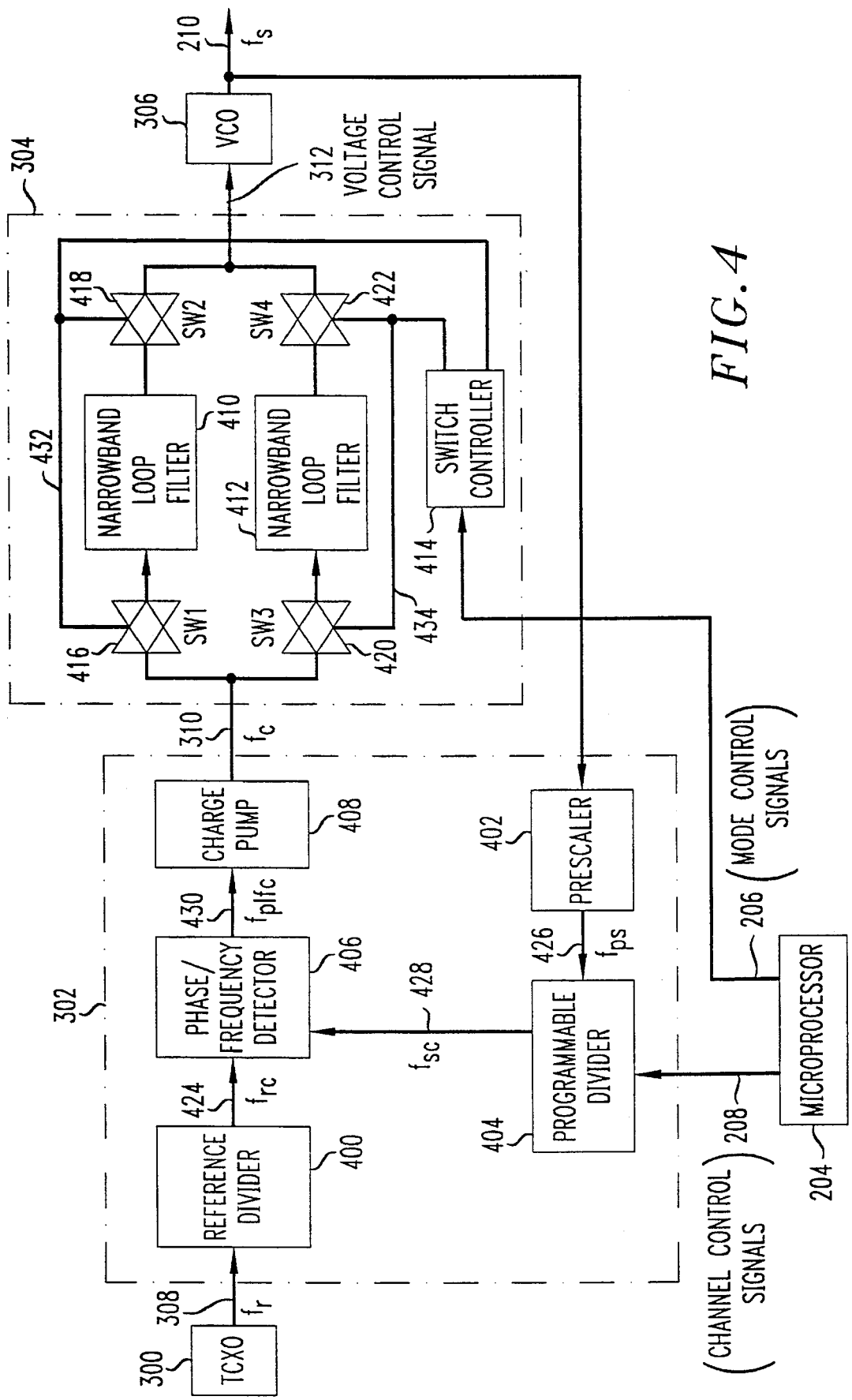
FIG. 4 is a detailed block diagram of a switchable filter phase-locked loop frequency synthesizer 202.

FIG. 4 is a detailed block diagram of the synthesizer 202. PLL synthesizer 302 comprises, a reference divider 400, a prescaler 402, a programmable divider 404, a phase/frequency detector 406, and a charge pump 408. Switchable loop filter 304 comprises, a narrowband low-pass filter 410, a wideband low-pass filter 412, a switch controller 414 with four analog single pole single throw (SPST) switches, switch 1 ($sw_1$) 416, switch 2 ($sw_2$) 418, switch 3 ($sw_3$) 420, and switch 4 ($sw_4$) 422. Alternate switches, such as two single pole double throw (SPDT) switches can also be used.

Microprocessor 204 controls programmable divider 404 via a serial interface including a clock line, a data line, and an enable line (illustrated in FIG. 4, as channel control signals 208). Alternate interface structures, such as the $I^2$ two wire system can also be used. Although the divider ratio of reference divider 400 and prescaler 402 can also be programmed, this embodiment uses these components with a predetermined divider ratio. Thus, these components are not representatively shown connected to channel control signals 208.

Microprocessor 204 also sends filter configuration information via mode control signals 206 to switch controller 414. In this embodiment, switch controller 414 is an output port of microprocessor 204 mapped to the to its memory space.

Reference divider 400 divides signal $f_r$ 308 down to an application specific frequency of synthesizer 202, producing a free-running reference comparison signal ($f_{rc}$) 424. In this embodiment, signal $f_{rc}$ 424 is set for 30 KHz. The output of VCO 306, signal $f_s$ 210, is also divided down by prescaler 402 and programmable divider 404, producing a prescaler signal ($f_{ps}$) 426 and a synthesized comparison signal ($f_{sc}$) 428, respectively.

Programmable divider 404, in conjunction with prescaler 402, effectuate channel switching. Although the frequency of signal $f_s$ 210 varies as different channels are used, signal $f_{sc}$ 428 is also maintained at the same application specified frequency as signal $f_{rc}$ 424. Programmable divider 404 contains an integer B and an integer A dividers. Prescaler 402 is a dual modulus 64/65 or 128/129 divider. The dual modulus features allows for more flexibility in dividing down signal $f_s$ 210. That is, signal $f_s$ 210 can be divided by either 64 and 65 or 128 and 129. In this embodiment, prescaler 402 is programmed by microprocessor 204 to divide by 64/65. The VCO 306 signal $f_s$ 210 is divided by both prescaler 402 and programmable divider 404 according to the following formula:

$$f_{sc}428 = f_s 210/(B*P+A)$$

Where:

P is the prescaler 402 divide ratio which is set to 64.

B is the divide ratio of the B divider in the programmable divider 404 and is set to equal to the whole number of the quotient:

$$B = INT(f_s 210/(P*f_{sc} 428))$$

A is the divide ratio of the A divider in the programmable divider 404 and is set to equal to:

$$A = (f_s 210/f_{sc} 428) - (B*P).$$

The following example illustrates how channel changes are accomplished with programmable divider 404 and prescaler 402. When cellular telephone 200 receives a channel code (for example, which corresponds to setting signal $f_s$ 210 to 870 MHz), microprocessor 204 calculates the integer values B and A to be downloaded into programmable divider 404 according to the above formula.

In this example, the value for B would be 453 (i.e., INT[870 MHz/(30 KHz*64]) and the value of A would be 8 (i.e., (870 MHz/30 KHz)−(453 *64)=8). The divided signal $f_{sc}$ is then equal to 30 KHz (i.e., 870 MHz/(453*64+8)). If, another channel frequency were used, for example 870.03 MHz, the value of B would be 453 and the value of A would be 9 (i.e., 870.03 MHz/(453*64+9)). Thus, for any given channel frequency, prescaler 402 with programmable divider 404 always divides the output of VCO 306, signal $f_s$ 210, down to the application specific comparison frequency, which is 30 KHz in this embodiment. In this example, each increment of one of the A divide ratio in the programmable divider 404 allows for a 30 KHz change in channel frequency.

Phase/frequency detector 406 compares signal $f_{rc}$ 424 with signal $f_{sc}$ 428 and generates a phase and frequency error signal ($f_{p/fe}$) 430, which corresponds to the phase and frequency discrepancy between signal $f_{rc}$ 424 and signal $f_{sc}$ 428. Frequency discrepancy is defined as a difference in the number of cycles per second between the two signals. Whereas, phase discrepancy is a measure of the difference of time displacement within a cycle. In this embodiment, phase detector/frequency 406 combines both the phase and frequency discrepancies into signal $f_{p/fe}$ 430. This is desirable because by detecting both types of discrepancies, PLL synthesizer 302 can more quickly bring the output of VCO 306, signal $f_s$ 210, in lock with the signal $f_{rc}$ 424. However, in other applications, the detection of only phase differences may be appropriate.

Charge pump 408 is a bi-directional current device. That is, in response signal $f_{p/fe}$ 430, change pump 408 either sources or sinks signal $f_e$ 310 (which is a current signal), into or out of switchable loop filter 304.

Loop filter 410 and 412 are low-pass filters, which in this embodiment are comprised of passive resistor and capacitor (RC) components. Active filtering, however, can also be used. These filter have two functions. First, they convert signal $f_e$ 310 into the proportional voltage control signal 312. Second, each loop filter is to attenuate the signal components of signal $f_e$ 310 (at comparison frequency $f_c$ and its harmonics and noise) that are beyond their respective bands.

The loop or cut-off frequency of each of these loop filters 410 and 412 is specifically tailored to optimize the performance of cellular telephone 200 in analog and digital modes of operation, respectively. In this regard, the loop filter designs are governed by two criteria, the channel switching time and spectral purity of signal $f_s$ 210.

For the digital mode, loop filter 412 which is a wideband low-pass loop filter (wideband loop filter), is used to allow for the fast channel switching required to facilitate the MAHO operation. The lower spectral purity of signal $f_s$ 210 caused by the wideband filter is tolerable, since the signal noise effect is less significant in the two logic state system. Accordingly, the cut-off frequency for loop filter 412 is set for 3–4 KHz.

For the analog mode, loop filter 410 which is a narrowband low-pass filter (narrowband loop filter), is used to increase the spectral purity of $f_s$ 210, thus eliminating the undesired noise and interference which directly affects the transmit and the receive audio signal perceived by the users. This is allowable in the analog mode because there is no requirement to support fast switching times, such as MAHO.

In this embodiment, the cut-off frequency for loop filter 410 is for 100–200 Hz.

Albeit this embodiment illustrates two loop filters in parallel, the present invention is not limited to such a configuration. For example, a third loop filter with the appropriate switching and control could be easily added in parallel to the other two filters, as dictated by the application.

In this embodiment, two sets of analog switches are used to ensure electrical isolation between loop filters 410 and 412. The first switch set, $sw_1$ 416 and $sw_2$ 418, connect the input of narrowband loop filter 410 to charge pump 408 and its output to VCO 306. This switch set is controlled by a narrowband control signal 432 produced by switch controller 414. The second switch set, $sw_3$ 420 and $sw_4$ 422, connects wideband loop filter 412 between these points and is controlled by a wideband control signal 434. Although analog switches are used in this embodiment, any type of electrical isolation may be used. In this embodiment, the four switches are incorporated into a standardized CMOS quad analog switch available from National Semiconductor and Motorola, as part number MM74HC4066 and MC14066B, respectively.

Once cellular telephone 200 receives a mode code, microprocessor 204 generates the corresponding mode control signals 206. When an analog mode code is received, switch controller 414 concurrently activates $sw_1$ 416 and $sw_2$ 418 and deactivates $sw_3$ 420 and $sw_4$ 422. While in the digital mode, switches $sw_1$ 416 and $sw_2$ 418 are deactivated and $sw_3$ 420 and $sw_4$ 422 are activated.

Figure 5:
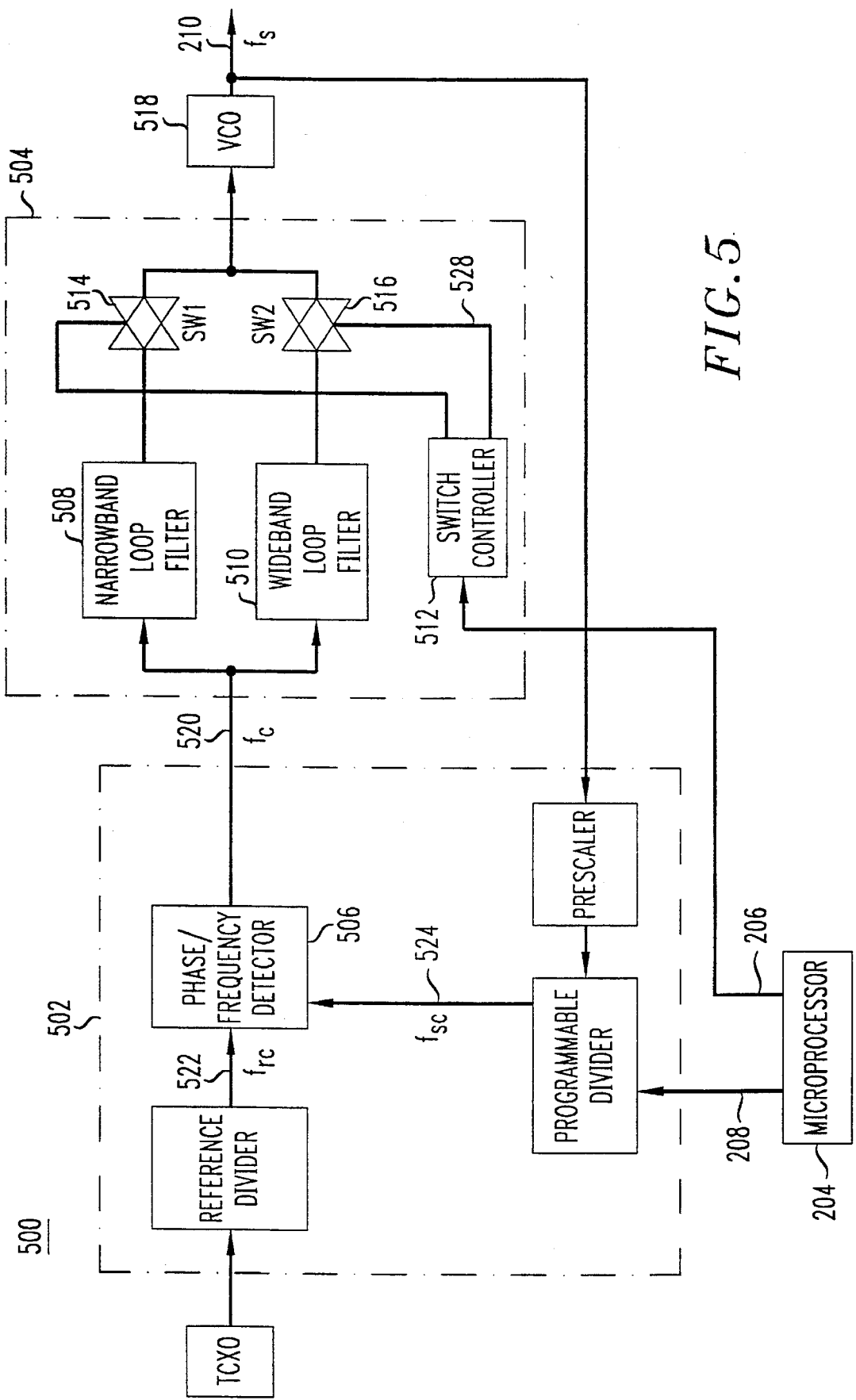
FIG. 5 is a detailed block diagram of a switchable filter phase-locked loop frequency synthesizer 500.

FIG. 5 illustrates an alternate preferred embodiment of the present invention in which synthesizer 202 is replaced with a switchable filter phase-locked loop frequency synthesizer 500. Synthesizer 500 is similar in operation to synthesizer 202. However, there are several component and configuration differences between these synthesizers. First, synthesizer 500 has a PLL frequency synthesizer 502 that does not utilize a current device (such as, charge pump 408) to drive a switchable loop filter 504. Instead, PLL synthesizer 502 has a phase detector/frequency detector 506 that produces a voltage error signal $f_e$ 520 (not a current error signal) that is proportional to the signal discrepancies between signal $f_{rc}$ 522 and signal $f_{sc}$ 524. Correspondingly, since signal $f_e$ 520 is already a voltage at the input to switchable loop filter 504, there is not a need to completely electrically isolate loop filters 508 and 510 (as there is with switchable loop filter 304). Therefore, switchable loop filter 504 has only two switches, a $sw_1$ 514 and a $sw_2$ 516 which are controlled by a narrowband control signal 526 and a wideband control signal 528, respectively. These control signals are produced by a switch controller 512. Since VCO 518 is an extremely sensitive device, the switches are arranged between the output of each loop filter 508 and 510 to ensure that VCO 518 does not receive signal noises from an unconnected loop filter. The advantages of this embodiment is its lower complexity and cost.

Figure 6:
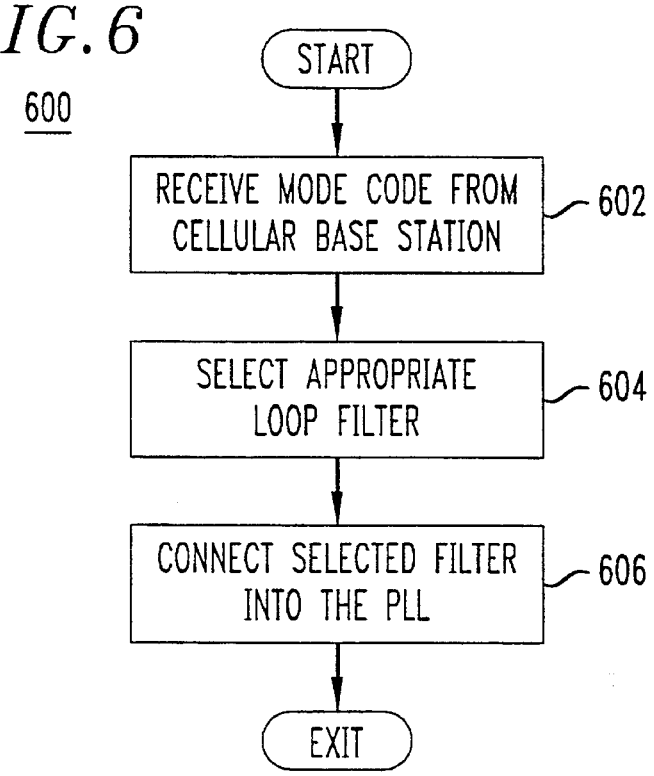
FIG. 6 is a flow diagram 600 illustrating a method of achieving dual-mode cellular communication with a switchable filter phase-locked loop frequency synthesizer, according to the present invention.

FIG. 6 is a flow diagram 600 illustrating a method of achieving dual-mode cellular communication with a switchable loop filter device, according to the present invention. In step 602, a mode code is received from a cellular base station. In step 604, the appropriate loop filter arrangement is selected based on the predetermined attributes of the loop filter and the received mode code. In step 606, the selected filter arrangement is connected into the PLL configuration.

While the invention has been particularly shown and described with reference to several preferred embodiments thereof, it will be understood by those skilled in the art that various changes in form and details may be made therein without departing from the spirit and scope of the invention as defined in the appended claims.

What is claimed is:

1. A device for providing multi-mode cellular telecommunications, comprising:

first means, for receiving an output signal and a reference signal and producing an error signal that is proportional to a difference between said output signal and said reference signal;

second means, for receiving a filtered signal and producing said output signal, wherein said output signal has frequency and phase characteristics proportional to said filtered signal;

third means, switchably coupled to said first and second means, for attenuating frequency components of said error signal beyond predetermined cut-off frequencies and producing said filtered signal;

fourth means, responsive to a mode control signal, for performing said switch coupling; and fifth means, for receiving a transmitted mode code and producing said mode control signal, wherein said first through fifth means permit the device to change to a mode of operation which corresponds to the mode of cellular communications.

2. The device of claim 1, wherein said third means comprises:

first filtering means for attenuating frequency components of said error signal for analog mode (AMPS) cellular communications; and second filtering means for attenuating frequency components of said error signal for digital mode (DAMPS) cellular communications.

3. The device of claim 2, wherein:

said first filtering means is a low-pass filter with a first predetermined cut-off frequency between about 100 Hz and 200 Hz;

said second filtering means is a low-pass filter with a second predetermined cut-off frequency between about 3 KHz and 4 KHz.

4. The device of claim 1, wherein said first means is a frequency synthesizer.

5. The device of claim 1, wherein said second means is a voltage controlled oscillator.

6. The device of claim 1, wherein said fourth means comprises an analog switch controller.

7. A cellular telecommunications device, comprising:

a frequency synthesizer that receives a reference signal and an output signal and produces an error signal that is proportional to a difference between said reference signal and said output signal;

an oscillator that receives a filtered signal and produces said output signal, wherein said output signal has frequency and phase characteristics proportional to said filtered signal;

first and second loop filters switchably coupled to said frequency synthesizer and said oscillator to attenuate frequency components of said error signal beyond first and second predetermined cut-off frequencies, respectively, to produce said filtered signal;

means for performing said switch coupling wherein said means is responsive to a mode control signal to permit the cellular telecommunication device to achieve multi-mode operation; and a controller that receives a transmitted mode code and produces said mode control signal in response to said mode code.

8. The device of claim 7, wherein said means:

couples said error signal from said frequency synthesizer to said first filter and an output of said first loop filter to said oscillator; or couples said error signal from said frequency synthesizer to said second filter and an output of said second loop filter to said oscillator.

9. The device of claim 7, wherein:

said first predetermined cut-off frequency is between 100 Hz and 200 Hz; and said second predetermined cut-off frequency is between 3 KHz and 4 KHz.

10. The device of claim 7, wherein said means comprises an analog switch controller.

11. The device of claim 7, wherein said difference corresponds to frequency components of said reference signal and said output signal.

12. The device of claim 7, wherein said error signal is a current signal.

13. A method for achieving multi-mode cellular communications with a phase-locked loop frequency synthesizer having a plurality of switchable loop filters, the method comprising the steps of:

receiving a transmitted mode code;

selecting an appropriate loop filter from the plurality of loop filters based on said mode code; and switching said appropriate loop filter into the phase-locked loop frequency synthesizer.

* * * * *